United States Patent
Xu et al.

(10) Patent No.: US 10,998,068 B2
(45) Date of Patent: May 4, 2021

(54) SHIFT REGISTER CIRCUIT AND DRIVING METHOD THEREFOR, AND GATE DRIVE CIRCUIT AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhuo Xu, Beijing (CN); Yuanbo Zhang, Beijing (CN); Yajie Bai, Beijing (CN); Haipeng Zhu, Beijing (CN); Yan Zhou, Beijing (CN); Hailong Wu, Beijing (CN); Heecheol Kim, Beijing (CN); Min Ran, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,669

(22) PCT Filed: Mar. 22, 2019

(86) PCT No.: PCT/CN2019/079276
§ 371 (c)(1),
(2) Date: Dec. 17, 2019

(87) PCT Pub. No.: WO2019/179521
PCT Pub. Date: Sep. 26, 2019

(65) Prior Publication Data
US 2020/0194089 A1  Jun. 18, 2020

(30) Foreign Application Priority Data

Mar. 23, 2018  (CN) .......................... 201810249611.8

(51) Int. Cl.
*G11C 19/28* (2006.01)
*G09G 3/20* (2006.01)
(Continued)

(52) U.S. Cl.
CPC ........... *G11C 19/28* (2013.01); *G09G 3/3208* (2013.01); *G09G 3/3648* (2013.01); *G09G 3/20* (2013.01);
(Continued)

(58) Field of Classification Search
CPC ....... G11C 19/28; G11C 19/00; G11C 19/287; G09G 3/3208; G09G 3/3648;
(Continued)

(56) References Cited

U.S. PATENT DOCUMENTS

2005/0057580 A1* 3/2005 Yamano ............... G09G 3/3283
345/690
2005/0168491 A1* 8/2005 Takahara ............. G09G 3/3241
345/690
(Continued)

FOREIGN PATENT DOCUMENTS

| CN | 103208251 A | 7/2013 |
| CN | 103489483 A | 1/2014 |

(Continued)

OTHER PUBLICATIONS

International Search Report and Written Opinion issued in corresponding International Application No. PCT/CN2019/079276, dated Jun. 27, 2019, with English language translation.
(Continued)

*Primary Examiner* — Julie Anne Watko
(74) *Attorney, Agent, or Firm* — McDermott Will and Emery LLP

(57) ABSTRACT

A shift register circuit includes a first circuit, M second circuits, and N third circuits. M and N are both positive integers, N is an integer multiple of M, M is greater than or equal to 2, and a quotient of N and M is greater than or equal to 2. The first circuit includes a first signal output terminal. Each second circuit includes a second signal input terminal connected to the first signal output terminal. Each third circuit includes a third signal input terminal that is connected to one of second signal input terminals of the M second circuits. A second signal output terminal of each second circuit is connected to third signal input terminals of N/M third circuits, and different second signal output terminals are connected to different third signal input terminals.

17 Claims, 6 Drawing Sheets

(51) Int. Cl.
*G09G 3/3208* (2016.01)
*G09G 3/36* (2006.01)

(52) U.S. Cl.
CPC ... *G09G 2310/0286* (2013.01); *G11C 19/287* (2013.01)

(58) Field of Classification Search
CPC ... G09G 2310/0286; G09G 2310/0267; G09G 2310/0264; G09G 2310/0202; G09G 2310/02; G09G 2310/00; G09G 3/3611; G09G 3/36; G09G 3/34; G09G 3/3225; G09G 3/22; G09G 3/2092; G09G 3/20; G09G 3/00; G09G 3/30; G09G 2300/0408; G06F 3/0416; G06F 3/04164; G06F 3/0443; G06F 3/04166

See application file for complete search history.

(56) References Cited

U.S. PATENT DOCUMENTS

| | | |
|---|---|---|
| 2012/0256817 A1* | 10/2012 | Chen ............... G11C 19/28 345/92 |
| 2015/0243237 A1 | 8/2015 | Li et al. |
| 2015/0243367 A1 | 8/2015 | Gu et al. |
| 2015/0340015 A1 | 11/2015 | Yoshida |
| 2016/0189796 A1 | 6/2016 | Wu et al. |
| 2017/0092209 A1 | 3/2017 | Cao |
| 2017/0178558 A1 | 6/2017 | Zhou et al. |
| 2018/0357974 A1 | 12/2018 | Zheng |
| 2019/0103166 A1 | 4/2019 | Yuan et al. |
| 2019/0114951 A1* | 4/2019 | Li ............... G11C 19/28 |
| 2020/0160929 A1* | 5/2020 | Huang ............... G09G 3/3674 |
| 2020/0194089 A1* | 6/2020 | Xu ............... G09G 3/3208 |

FOREIGN PATENT DOCUMENTS

| | | |
|---|---|---|
| CN | 104867439 A | 8/2015 |
| CN | 105096789 A | 11/2015 |
| CN | 106297697 A | 1/2017 |
| CN | 107464521 A | 12/2017 |
| CN | 107507556 A | 12/2017 |
| JP | 2005-228459 A | 8/2005 |

OTHER PUBLICATIONS

First Chinese Office Action issued in corresponding Chinese Application No. 201810249611.8, dated Apr. 3, 2020, with English language translation.

* cited by examiner

SHIFT REGISTER CIRCUIT AND DRIVING METHOD THEREFOR, AND GATE DRIVE CIRCUIT AND DISPLAY DEVICE

CROSS-REFERENCE TO RELATED APPLICATIONS

This application is a national phase entry under 35 USC 371 of International Patent Application No PCT/CN2019/079276 filed on Mar. 22, 2019, which claims priority to and benefits of Chinese Patent Application No. 201810249611.8, which are incorporated herein by reference in their entirety.

TECHNICAL FIELD

The present disclosure relates to the field of display technologies, and in particular, to a shift register circuit and a driving method for the shift register circuit, a gate drive circuit, and a display device.

BACKGROUND

Thin film transistor liquid crystal displays (TFT-LCDs) and organic light-emitting diodes (OLEDs) are increasingly used in the high performance display field. In order to increase a screen-to-body ratio of a display device as much as possible, a gate drive circuit is usually set as a gate driver on array (GOA) circuit.

SUMMARY

In a first aspect, a shift register circuit is provided. The shift register circuit includes a first circuit, M second circuits, and N third circuits. M and N are both positive integers, N is an integer multiple of M, M is greater than or equal to 2, and a quotient of N and M is greater than or equal to 2. The first circuit includes a first signal output terminal. The first circuit is configured to output a voltage of a first clock signal terminal as an operating voltage via the first signal output terminal under control of a signal received by the first signal input terminal, and output a voltage of a first voltage terminal as a turn-off voltage via the first signal output terminal under control of a signal received by a first reset signal terminal and a signal received by a second clock signal terminal. The second circuit includes a second signal input terminal connected to the first signal output terminal, a second signal output terminal, and a control clock signal terminal. The second circuit is configured to output a voltage of the control clock signal terminal as an operating voltage via the second signal output terminal under control of a signal received by the second signal input terminal. The third circuit includes an output clock signal terminal, a third signal input terminal that is connected to one of second signal input terminals of the M second circuits, and a third signal output terminal. The third circuit is configured to output a voltage of the output clock signal terminal as an operating voltage via the third signal output terminal under control of a signal received by the third signal input terminal. A second signal output terminal of each second circuit is connected to third signal input terminals of N/M third circuits. Different second signal output terminals are connected to different third signal input terminals.

In some embodiments of the present disclosure, the first circuit includes an input sub-circuit, an energy storage sub-circuit, a first output sub-circuit, a first reset sub-circuit, a pull-down control sub-circuit, and a pull-down sub-circuit. The input sub-circuit is connected to the first signal input terminal and a pull-up node, and the input sub-circuit is configured to output a voltage of the first signal input terminal to the pull-up node under the control of the first signal input terminal. The energy storage sub-circuit is connected to the pull-up node and the first signal output terminal, and the energy storage sub-circuit is configured to store a voltage on the pull-up node or charge the pull-up node. The first output sub-circuit is connected to the pull-up node, the first clock signal terminal, and the first signal output terminal. The first output sub-circuit is configured to output the voltage of the first clock signal terminal to the first signal output terminal under control of the pull-up node. The first reset sub-circuit is connected to the first reset signal terminal, the first voltage terminal, and the pull-up node. The first reset sub-circuit is configured to output the voltage of the first voltage terminal to the pull-up node under the control of the first reset signal terminal. The pull-down control sub-circuit is connected to the second clock signal terminal, the first voltage terminal, the pull-up node, and a pull-down node. The pull-down control sub-circuit is configured to output a voltage of the second clock signal terminal to the pull-down node under the control of the second clock signal terminal, or output the voltage of the first voltage terminal to the pull-down node under the control of the pull-up node. The pull-down sub-circuit is connected to the pull-down node, the first voltage terminal, and the first signal output terminal, and the pull-down sub-circuit is configured to output the voltage of the first voltage terminal to the first signal output terminal under control of the pull-down node.

In some embodiments of the present disclosure, the first circuit further includes a noise reduction signal output terminal. The first circuit is configured to output a voltage of the second clock signal terminal as a noise reduction voltage via the noise reduction signal output terminal under the control of a signal received by the second clock signal terminal. The second circuit further includes an intermediate noise reduction sub-circuit. The intermediate noise reduction sub-circuit is connected to the noise reduction signal output terminal, the first voltage terminal, and the second signal output terminal. The intermediate noise reduction sub-circuit is configured to output the voltage of the first voltage terminal to the second signal output terminal under control of the noise reduction signal output terminal, so as to perform noise reduction on the second circuit. The third circuit further includes an output noise reduction sub-circuit, and the output noise reduction sub-circuit is connected to the noise reduction signal output terminal, the first voltage terminal, and the third signal output terminal. The output noise reduction sub-circuit is configured to output the voltage of the first voltage terminal to the third signal output terminal under the control of the noise reduction signal output terminal, so as to perform the noise reduction on the third circuit.

In some embodiments of the present disclosure, the input sub-circuit includes a first transistor. A gate electrode and a first electrode of the first transistor are connected to the first signal input terminal, and a second electrode of the first transistor is connected to the pull-up node. And/or, the energy storage sub-circuit includes a first capacitor, one end of the first capacitor is connected to the pull-up node, and another end of the first capacitor is connected to the first signal output terminal. And/or, the first output sub-circuit includes a second transistor, a gate electrode of the second transistor is connected to the pull-up node, a first electrode of the second transistor is connected to the first clock signal terminal, and a second electrode of the second transistor is connected to the first signal output terminal. And/or, the first reset sub-circuit includes a third transistor, a gate electrode of the third transistor is connected to the first reset signal, a first electrode of the third transistor is connected to the pull-up node, and a second electrode of the third transistor is connected to the first voltage terminal. And/or, the pull-down control sub-circuit includes a fourth transistor and a fifth transistor. A gate electrode and a first electrode of the fourth transistor are connected to the second clock signal terminal, and a second electrode of the fourth transistor is connected to the pull-down node. A gate electrode of the fifth transistor is connected to the pull-up node, a first electrode of the fifth transistor is connected to the pull-down node, and a second electrode of the fifth transistor is connected to the first voltage terminal. And/or, the pull-down sub-circuit includes a sixth transistor, a gate electrode of the sixth transistor is connected to the pull-down node, a first electrode of the sixth transistor is connected to the first signal output terminal, and a second electrode of the sixth transistor is connected to the first voltage terminal. And/or, the second circuit includes a seventh transistor, a gate electrode of the seventh transistor is connected to the second signal input terminal, a first electrode of the seventh electrode is connected to the control clock signal terminal, and a second electrode of the seventh transistor is connected to the second signal output terminal. And/or, the third circuit includes an eighth transistor, a gate electrode of the eighth transistor is connected to the third signal input terminal, a first electrode of the eighth transistor is connected to the output clock signal terminal, and a second electrode of the eighth transistor is connected to the third signal output terminal.

In some embodiments of the present disclosure, the first circuit further includes the noise reduction signal output terminal, the second circuit includes the intermediate noise reduction sub-circuit, and the third circuit includes the output noise reduction sub-circuit, the noise reduction signal output terminal is connected to the pull-down node. The intermediate noise reduction sub-circuit includes a ninth transistor. A gate electrode of the ninth transistor is connected to the noise reduction signal output terminal, a first electrode of the ninth transistor is connected to the second signal output terminal, and a second electrode of the ninth transistor is connected to the first voltage terminal. The output noise reduction sub-circuit includes a tenth transistor, a gate electrode of the tenth transistor is connected to the noise reduction signal output terminal, a first electrode of the tenth transistor is connected to the third signal output terminal, and a second electrode of the tenth transistor is connected to the first voltage terminal.

In some embodiments of the present disclosure, M is less than or equal to 4, and the quotient of N and M is less than or equal to 6.

In some embodiments of the present disclosure, M is 2 and N is 8.

In a second aspect, a gate drive circuit including two gate drive sub-circuits is provided. Each gate drive sub-circuit includes at least two stages of cascaded shift register circuits described above. Third signal output terminals of the two gate drive sub-circuit are configured to be connected to gate lines arranged in sequence. The gate lines are divided into different gate line groups in a manner in which N gate lines form a gate line group. In the two gate drive sub-circuits, one gate drive sub-circuit is configured to be connected to gate lines in odd-numbered gate line groups arranged in sequence, and another gate drive sub-circuit is configured to be connected to gate lines in even-numbered gate line groups arranged in sequence. In each gate drive sub-circuit, a first signal input terminal of a first-stage shift register circuit is connected to a start signal terminal. Except for the first-stage shift register circuit, a first signal input terminal of a shift register circuit in any stage is connected to a first signal output terminal of a shift register circuit in a previous stage. Except for a last-stage shift register circuit, a first reset signal terminal of a shift register circuit in any stage is connected to a first signal output terminal of a shift register circuit in a next stage.

In a third aspect, a display device is provided. The display device includes the gate drive circuit described above.

In a fourth aspect, a driving method for the shift register circuit described above is provided. The driving method includes: receiving, by the first circuit, a first input signal from the first signal input terminal and a first clock signal from the first clock signal terminal; outputting, by the first circuit, the first clock signal as an operating voltage via the first signal output terminal under control of the first input signal; receiving, by the M second circuits, M different control clock signals from control clock signal terminals; outputting, by the M second circuits, the M different control clock signals as operating voltages respectively via M second signal output terminals under control of the operating voltage output via the first signal output terminal; receiving, by the N third circuits, N different output clock signals from output clock signal terminals respectively; outputting, by the N third circuits, the N different output clock signals as operating voltages respectively via N third signal output terminals under control of the operating voltage output via the second signal output terminal. An operating voltage period corresponding to N/M output clock signals input to N/M third circuits connected to a same second circuit is within an operating voltage period corresponding to a control clock signal input to the second circuit. An operating voltage period corresponding to M control clock signals input to the M second circuits connected to the first circuit is within an operating voltage period corresponding to the first clock signal input to the first circuit. The driving method further includes: receiving, by the first circuit, a first reset signal from the first reset signal terminal of the first circuit and a second clock signal from the second clock signal terminal of the first circuit, and outputting, by the first circuit, a voltage of the first voltage terminal as a turn-off voltage via the first signal output terminal under control of the first reset signal and the second clock signal. The second clock signal and the first clock signal are a group of opposite clock signals.

In some embodiments of the present disclosure, in a case where the first circuit further includes a noise reduction signal output terminal, the second circuit includes an intermediate noise reduction sub-circuit, and the third circuit includes an output noise reduction sub-circuit. The method further comprises: after receiving the second clock signal from the second clock signal terminal, outputting, by the first circuit, the second clock signal to the intermediate noise reduction sub-circuit of the second circuit and the output noise reduction sub-circuit of the third circuit through the noise reduction signal output terminal under the control of the second clock signal.

In some embodiments of the present disclosure, the operating voltage is a high level voltage.

In some embodiments of the present disclosure, the N different output clock signals received by N output clock signal terminals of the N third circuits are sequentially delayed by at least a minimum write pulse width of a pixel voltage.

In some embodiments of the present disclosure, the first clock signal and the second clock signal each have a pulse width of 16 H and a duty ratio of 50%. Each control clock signal has a pulse width of 8 H and a duty ratio of 50%. Each output clock signal has a pulse width of 4 H and a duty ratio of less than or equal to 50%, wherein H is a write pulse width of a pixel voltage.

In some embodiments of the present disclosure, a high level of each output clock signal is a turn-on voltage of thin film transistors in an active area, and a low level of the output clock signal is less than a turn-off voltage of the thin film transistors in the active area. And/or, a high level of each control clock signal is greater than a turn-on voltage of the thin film transistors in the active area. And/or, high levels of the first clock signal and the second clock signal are less than the turn-on voltage of the thin film transistors in the active area.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
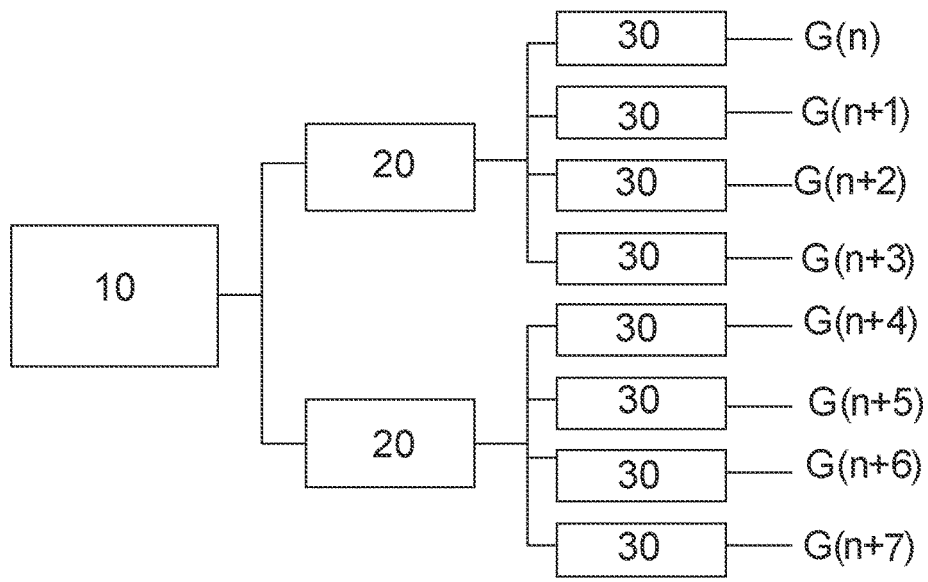
FIG. 1 is a schematic diagram showing a structure of a shift register circuit, according to some embodiments of the present disclosure.

Some embodiments of the present disclosure provide a shift register circuit. Referring to FIG. 1, the shift register circuit includes a first circuit 10, M second circuits 20, and N third circuits 30. M and N are positive integers, N is an integer multiple of M, M is greater than or equal to 2, and a quotient of N and M is greater than or equal to 2.

In some embodiments of the present disclosure, considering an actual wiring and a signal control of the shift register circuit, M is less than or equal to 4, and the quotient of N and M is less than or equal to 6. According to actual experience and a signal selection, as shown in FIG. 1, M is 2, and N is 8. That is, the quotient of N and M is 4. The following embodiments are all described by taking an example in which M is 2 and N is 8.

Figure 2:
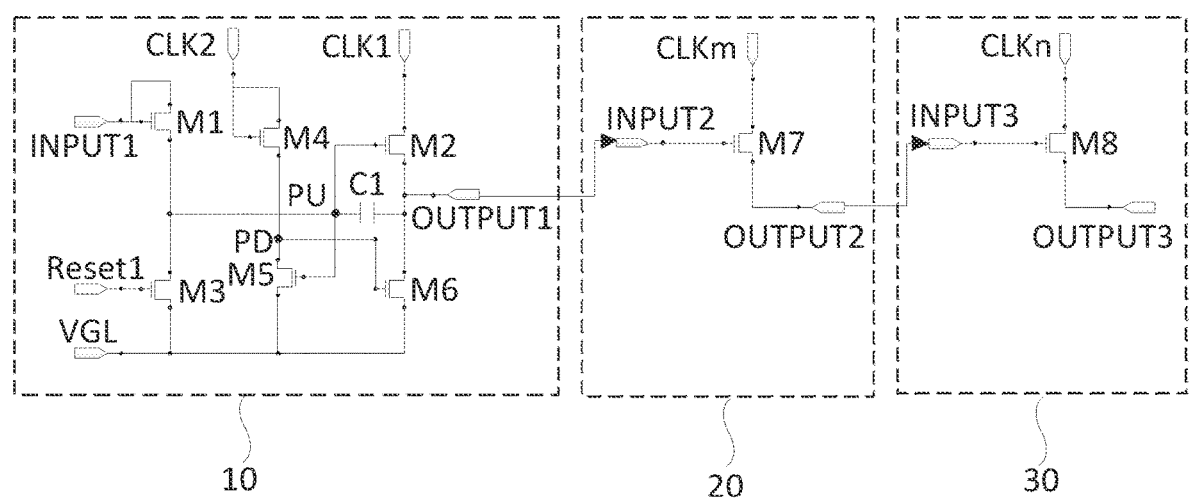
FIG. 2 is a schematic diagram showing a detailed structure of a shift register circuit, according to some embodiments of the present disclosure.

In some embodiments of the present disclosure, as shown in FIG. 2, the first circuit 10 includes a first signal input terminal INPUT1, a first clock signal terminal CLK1, a second clock signal terminal CLK2, a first voltage terminal VGL, a first reset signal terminal Reset1, and a first signal output terminal OUTPUT1. The first circuit 10 is configured to output a voltage of the first clock signal terminal CLK1 as an operating voltage via the first signal output terminal OUTPUT1 under control of a signal received by the first signal input terminal INPUT1, or output a voltage of the first voltage terminal VGL as a turn-off voltage via the first signal output terminal OUTPUT1 under control of a signal received by the first reset signal terminal Reset1 and a signal received by the second clock signal terminal CLK2.

The second circuit 20 includes a second signal input terminal INPUT2, a second signal output terminal OUTPUT2, and a control clock signal terminal CLKm. The second circuit 20 is configured to output a voltage of the control clock signal terminal CLKm as an operating voltage via the second signal output terminal OUTPUT2 under control of a signal received by the second signal input terminal INPUT2. Different second circuits 20 are connected to different control clock signal terminals CLKm. That is, the M second circuits 20 are connected to M control clock signal terminals in one-to-one correspondence. For example, the M control clock signal terminals may be CLKm1, CLKm2, CLKm3, . . . .

The third circuit 30 includes an output clock signal terminal CLKn, a third signal input terminal INPUT3, and a third signal output terminal OUTPUT3. The third circuit 30 is configured to output a voltage of the output clock signal terminal CLKn as an operating voltage via the third signal output terminal OUTPUT3 under control of a signal received by the third signal input terminal INPUT3. Different third circuits 30 are connected to different output clock signal terminals CLKn. That is, the N third circuits 30 are connected to N output clock signal terminals in one-to-one correspondence. For example, the N output clock signal terminals may be CLKn1, CLKn2, CLKn3, . . . .

In some embodiments of the present disclosure, referring to FIG. 1 and FIG. 2, in the above shift register circuit, the first signal output terminal OUTPUT1 of the first circuit 10 is connected to second signal input terminals INPUT2 of the two second circuits 20 (in this case, M is 2) (different second circuits are provided with different second signal input terminals).

A second signal output terminal OUTPUT2 of each second circuit 20 is connected to third signal input terminals INPUT3 of four third circuits 30 (in this case, N is 8, that is, the quotient of N and M is 4), and different second signal output terminals OUTPUT2 are connected to different third signal input terminals INPUT3.

In some embodiments of the present disclosure, FIG. 2 only shows a connection relationship among the first circuit 10, a single second circuit 20 and a single third circuit 30.

As for other second circuit(s) 20 and third circuits 30, reference may be made to the connection relationship between corresponding circuits in FIG. 2.

It will be understood that the operating voltage in some embodiments of the present disclosure refers to a voltage applied to a certain circuit to effectively control the circuit to work. According to a setting structure of the circuit, the operating voltage may be different, which is not limited.

In summary, in the shift register circuit provided by some embodiments of the present disclosure, a plurality of third circuits are independently provided. When the plurality of third circuits are applied to the gate drive circuit, third signal output terminals of the plurality of third circuits independently provided are connected to corresponding gate lines respectively, so that adjacent gate lines are independent of each other. Compared with a situation in which in some gate drive circuits, a single gate line is connected to two adjacent cascaded shift register circuits, the shift register circuit provided by some embodiments of the present disclosure is connected to corresponding gate lines through the plurality of third circuits independently provided, thereby greatly reducing a probability of a poor signal transmission.

For example, some embodiments of the present disclosure provide setting structures of the first circuit 10, the second circuit 20 and the third circuit 30.

Figure 3:
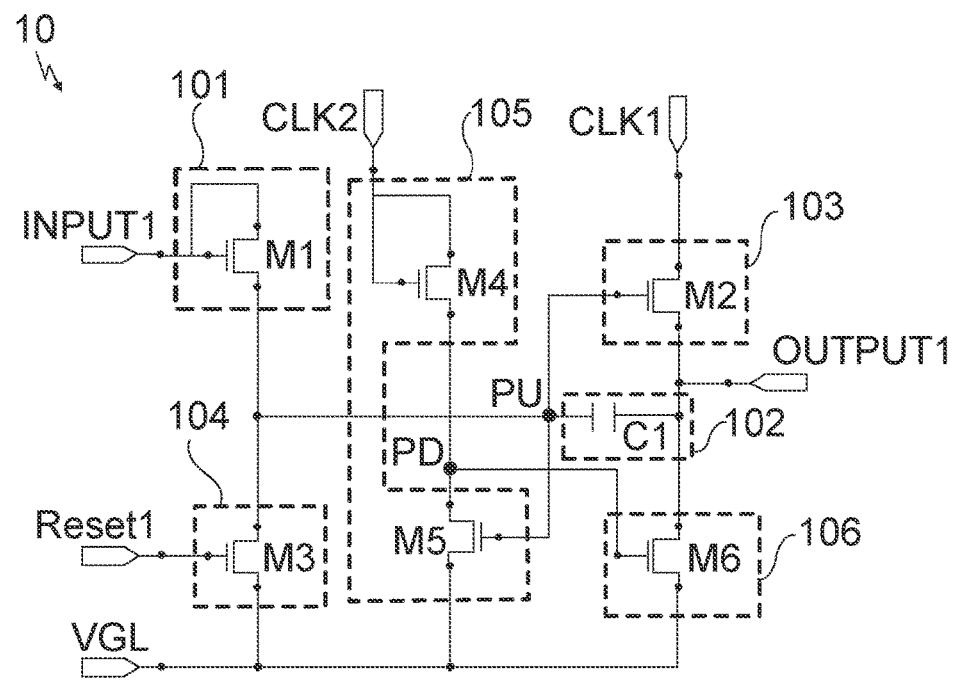
FIG. 3 is a circuit diagram showing a structure of a first circuit in a shift register circuit, according to some embodiments of the present disclosure.

In some embodiments of the present disclosure, as shown in FIG. 3, the first circuit 10 includes an input sub-circuit 101, an energy storage sub-circuit 102, a first output sub-circuit 103, a first reset sub-circuit 104, a pull-down control sub-circuit 105, and a pull-down sub-circuit 106.

The first input sub-circuit 101 is connected to the first signal input terminal INPUT1 and a pull-up node PU, and the first input sub-circuit 101 is configured to transmit a voltage of the first signal input terminal INPUT1 to the pull-up node PU under the control of the first signal input terminal INPUT1.

In some embodiments of the present disclosure, as shown in FIG. 3, the input sub-circuit 101 includes a first transistor M1. A gate electrode and a first electrode of the first transistor M1 are connected to the first signal input terminal INPUT1, and a second electrode of the first transistor M1 is connected to the pull-up node PU.

The energy storage sub-circuit 102 is connected to the pull-up node PU and the first signal output terminal OUTPUT1, and the energy storage sub-circuit 102 is configured to store a voltage on the pull-up node PU or charge the pull-up node PU.

Referring to FIG. 3, the energy storage sub-circuit 102 includes a first capacitor C1. One end of the first capacitor C1 is connected to the pull-up node PU, and another end of the first capacitor C1 is connected to the first signal output terminal OUTPUT1.

The first output sub-circuit 103 is connected to the pull-up node PU, the first clock signal terminal CLK1, and the first signal output terminal OUTPUT1. The first output sub-circuit 103 is configured to transmit the voltage of the first clock signal terminal CLK1 to the first signal output terminal OUTPUT1 under control of the pull-up node PU.

Referring to FIG. 3, the first output sub-circuit 103 includes a second transistor M2. A gate electrode of the second transistor M2 is connected to the pull-up node PU, a first electrode of the second transistor M2 is connected to the first clock signal terminal CLK1, and a second electrode of the second transistor M2 is connected to the first signal output terminal OUTPUT1.

The first reset sub-circuit 104 is connected to the first reset signal terminal Reset1, the first voltage terminal VGL, and the pull-up node PU. The first reset sub-circuit 104 is configured to transmit the voltage of the first voltage terminal VGL to the pull-up node PU under the control of the first reset signal terminal Reset1.

As shown in FIG. 3, the first reset sub-circuit 104 includes a third transistor M3. A gate electrode of the third transistor M3 is connected to the first reset signal terminal Reset1, a first electrode of the third transistor M3 is connected to the first voltage terminal VGL, and a second electrode of the third transistor M3 is connected to the pull-up node PU.

The pull-down control sub-circuit 105 is connected to the second clock signal terminal CLK2, the first voltage terminal VGL, the pull-up node PU, and a pull-down node PD. The pull-down control sub-circuit 105 is configured to transmit a voltage of the second clock signal terminal CLK2 to the pull-down node PD under the control of the second clock signal terminal CLK2, or transmit the voltage of the first voltage terminal VGL to the pull-down node PD under the control of the pull-up node PU.

As shown in FIG. 3, the pull-down control sub-circuit 105 may include a fourth transistor M4 and a fifth transistor M5. A gate electrode and a first electrode of the fourth transistor M4 are connected to the second clock signal terminal CLK2, and a second electrode of the fourth transistor M4 is connected to the pull-down node PD. A gate electrode of the fifth transistor M5 is connected to the pull-up node PU, a first electrode of the fifth transistor M5 is connected to the first voltage terminal VGL, and a second electrode of the fifth transistor M5 is connected to the pull-down node PD.

The pull-down sub-circuit 106 is connected to the pull-down node PD, the first voltage terminal VGL and the first signal output terminal OUTPUT1. The pull-down sub-circuit 106 is configured to transmit the voltage of the first voltage terminal VGL to the first signal output terminal OUTPUT1 under control of the pull-down node PD.

Referring to FIG. 3, the pull-down sub-circuit 106 includes a sixth transistor M6. A gate electrode of the sixth transistor M6 is connected to the pull-down node PD, a first electrode of the sixth transistor M6 is connected to the first voltage terminal VGL, and a second electrode of the sixth transistor is connected to the first signal output terminal OUTPUT1.

Based on this, referring to FIG. 2, the second circuit 20 may include a seventh transistor M7. A gate electrode of the seventh transistor M7 is connected to the second signal input terminal INPUT2 (that is, the gate electrode is connected to the first signal output terminal OUTPUT1), a first electrode of the seventh transistor M7 is connected to the control clock signal terminal CLKm, and a second electrode of the seventh transistor M7 is connected to the second signal output terminal OUTPUT2.

The third circuit 30 may include an eighth transistor M8. A gate electrode of the eighth transistor M8 is connected to the third signal input terminal INPUT3 (that is, the gate electrode is connected to the second signal output terminal OUTPUT2), a first electrode of the eighth transistor M8 is connected to the output clock signal terminal CLKn, and a second electrode of the eighth transistor M8 is connected to the third signal output terminal OUTPUT3. The third signal output terminal OUTPUT3 is connected to a gate line G in practical applications.

Figure 4:
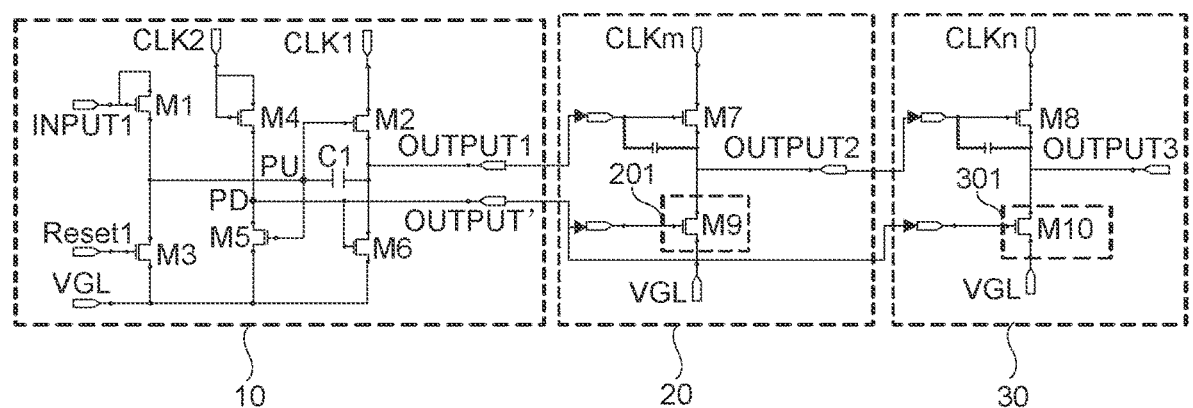
FIG. 4 is a schematic diagram showing a detailed structure of another shift register circuit, according to some embodiments of the present disclosure.

In some embodiments of the present disclosure, in order to reduce noise of signals output by the shift register circuit when applied, referring to FIG. 3 and FIG. 4, the first circuit 10 further includes a noise reduction signal output terminal OUTPUT' connected to the pull-down node PD. The first circuit, such as the pull-down control sub-circuit 105, is configured to output the voltage of the second clock signal terminal CLK2 as a noise reduction voltage via the noise reduction signal output terminal OUTPUT' under the control of the second clock signal terminal CLK2.

In this case, referring to FIG. 4, the second circuit 20 further includes an intermediate noise reduction sub-circuit 201, and the intermediate noise reduction sub-circuit 201 is connected to the noise reduction signal output terminal OUTPUT', the first voltage terminal VGL and the second signal output terminal OUTPUT2. The intermediate noise reduction sub-circuit 201 is configured to transmit the voltage of the first voltage terminal VGL to the second signal output terminal OUTPUT2 under control of the noise reduction signal output terminal OUTPUT' to reduce the noise of the second circuit 20. It will be noted that in some embodiments of the present disclosure, a storage capacitor (shown by a dotted line in FIG. 4) may also be provided between the gate electrode of the seventh transistor M7 and the second signal output terminal OUTPUT2 in the second circuit 20, so as to reduce noise generated by the seventh transistor M7 due to a parasitic capacitor of the seventh transistor M7, thereby further reducing the noise of the output signals. Of course, if the storage capacitor is not provided, a normal operation will not be affected.

Moreover, referring to FIG. 4, the third circuit 30 further includes an output noise reduction sub-circuit 301, and the output noise reduction sub-circuit 301 is connected to the noise reduction signal output terminal OUTPUT', the first voltage terminal VGL and the third signal output terminal OUTPUT3. The output noise reduction sub-circuit 301 is configured to transmit the voltage of the first voltage terminal VGL to the third signal output terminal OUTPUT3 under the control of the noise reduction signal output terminal OUTPUT' to reduce the noise of the third circuit 30. As mentioned above, in some embodiments of the present disclosure, a storage capacitor (shown by a dotted line in FIG. 4) may also be provided between the gate electrode of the eighth transistor M8 and the third signal output terminal OUTPUT3 in the third circuit 30, so as to reduce noise generated by the the eighth transistor M8 due to a parasitic capacitor of the eighth transistor M8, thereby further reducing the noise of the output signals. Of course, if the storage capacitor is not provided, the normal operation will not be affected.

In some embodiments of the present disclosure, on a basis that the first circuit 10 is the above circuit in FIG. 3, the noise reduction signal output terminal OUTPUT' may be arranged to be connected to the pull-down node PD (referring to FIG. 4), so that the voltage of the second clock signal terminal CLK2 is output as the noise reduction voltage to the noise reduction signal output terminal OUTPUT' under the control of the second clock signal terminal CLK2, and the intermediate noise reduction sub-circuit 201 and the output noise reduction sub-circuit 301 are controlled through the noise reduction signal output terminal OUTPUT', so as to perform a step-by-step noise reduction on the second circuit 20 and the third circuit 30.

In some embodiments of the present disclosure, referring to FIG. 4, the intermediate noise reduction sub-circuit 201 may include a ninth transistor M9. A gate electrode of the ninth transistor M9 is connected to the noise reduction signal output terminal OUTPUT', a first electrode of the ninth transistor M9 is connected to the first voltage terminal VGL, and a second electrode of the ninth transistor M9 is connected to the second signal output terminal OUTPUT2.

The output noise reduction sub-circuit 301 may include a tenth transistor M10. A gate electrode of the tenth transistor M10 is connected to the noise reduction signal output terminal OUTPUT', a first electrode of the tenth transistor M10 is connected to the first voltage terminal VGL, and a second electrode of the tenth transistor M10 is connected to the third signal output terminal OUTPUT3.

In summary, on the one hand, referring to FIG. 4, it will be understood that, the voltage of the second clock signal terminal CLK2 is output as the noise reduction voltage to the noise reduction signal output terminal OUTPUT' under the control of the second clock signal terminal CLK2. Moreover, a signal output from the noise reduction signal output terminal OUTPUT' (that is, a signal from the second clock signal terminal CLK2) may be used to perform a horizontal step-by-step noise reduction on the second circuit 20 and the third circuit 30 (through the first voltage terminal VGL). That is, when the shift register circuit is applied to the gate drive circuit, noise inside the gate drive circuit may be horizontally attenuated step by step (referring to a simulation diagram of the output signals in FIG. 7), and a vertical transfer will not occur, which is beneficial to a stability of an actual display and meet requirements of low risk and high controllability of a product.

On the other hand, as for the shift register circuit provided in some embodiments of the present disclosure, taking the circuit in FIG. 4 as an example, the first circuit 10 has a 6T1C circuit structure (i.e., 6 transistors and 1 capacitor), the second circuit 20 has a 2T0C circuit structure (of course, the second circuit 20 may also have a 2T1C circuit structure), and the third circuit 30 has a 2T0C circuit structure (of course, the third circuit 30 may also have a 2T1C circuit structure). It will be understood that a signal-to-noise ratio of a signal output by the shift register circuit (referring to a simulation diagram of the output signals in FIG. 8) may substantially reach a same output level as the shift register circuit having a 12T1C circuit structure in the gate drive circuit driven step by step. It will be noted that, in each shift register circuit in some embodiments of the present disclosure, 26 transistors (6 transistors in the first circuit, 2 transistors in each of the two second circuits, i.e., 4 transistors in the two second circuits, and 8 transistors in each of the 8 third circuits, i.e., 16 transistors in the 8 third circuits, totaling 26 transistors) are used, and up to 11 capacitors (or the single capacitor in the first circuit) are used, that is, 26T11C, so as to control 8 gate lines. That is, on average, each gate line substantially corresponds to 3.25 transistors and 1 capacitor (i.e., 3.25T1C).

That is to say, the shift register circuit in some embodiments of the present disclosure may greatly reduce the number of transistors used while having the same output level as the shift register circuit having the 12T1C circuit structure, thereby simplifying a manufacturing process, reducing a manufacturing cost, and reducing a distribution space of the gate drive circuit (the gate drive circuit is generally disposed on a bezel of the product). Therefore, a width of the bezel of the product is reduced (that is, a screen-to-body ratio of a display device is increased), which may facilitate a narrow bezel of the product.

Figure 5:
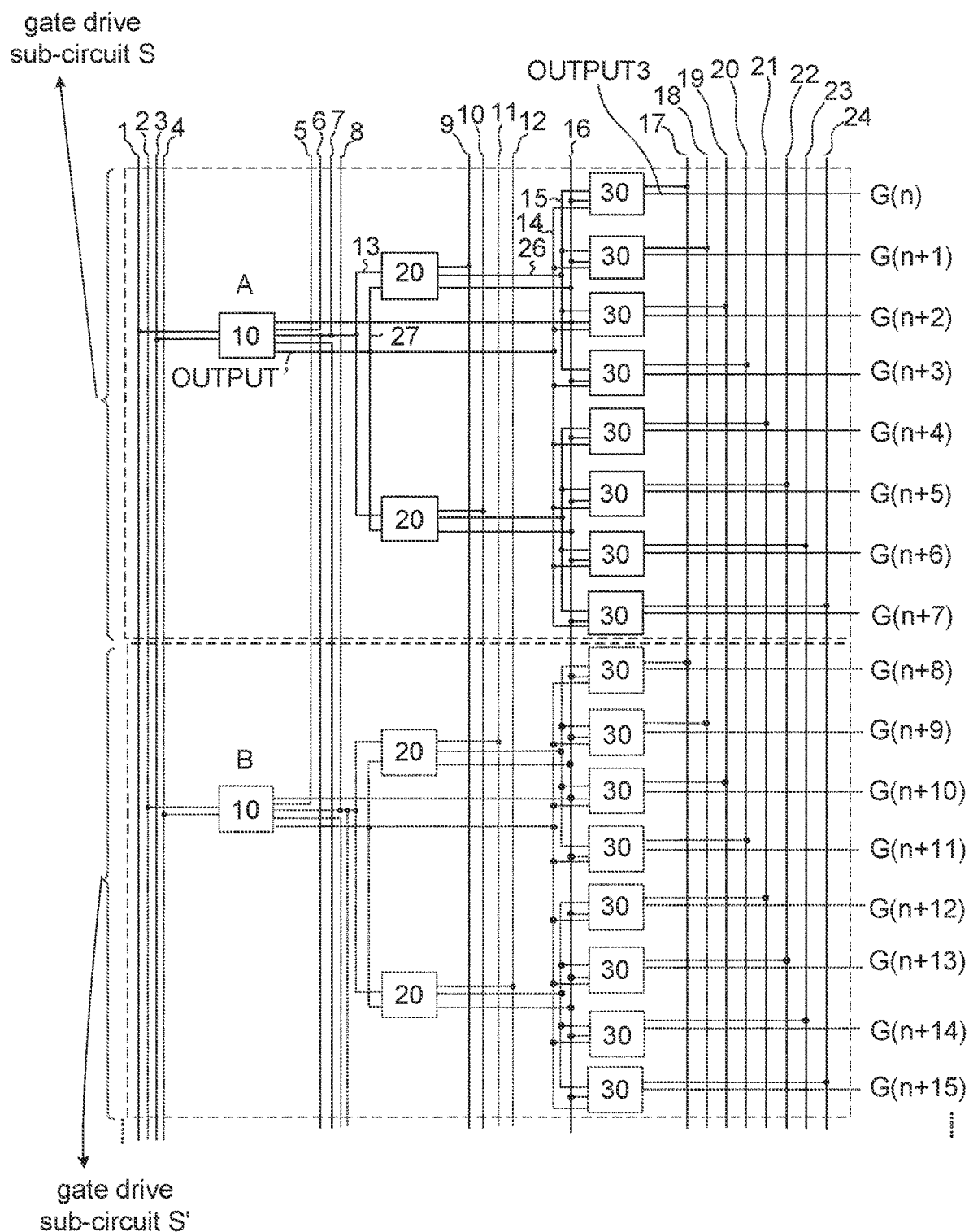
FIG. 5 is a schematic diagram showing a structure of a gate drive circuit, according to some embodiments of the present disclosure.

Some embodiments of the present disclosure provide a gate drive circuit. As shown in FIG. 5, the gate drive circuit includes two gate drive sub-circuits (S and S'). Each gate drive sub-circuit includes at least two stages of cascaded shift register circuits described above. FIG. 5 only shows two shift register circuit respectively included in the two gate drive sub-circuits. That is, a shift register circuit A shown by a solid line in a gate drive sub-circuit S, and a shift register circuit B shown by a dotted line in a gate drive sub-circuit S' are shown in FIG. 5. Beneficial effects of the gate drive circuit are the same as beneficial effects of the above shift register circuit, which are not described herein again.

In some embodiments of the present disclosure, third signal output terminals OUTPUT3 of the gate drive circuit (that is, the third signal output terminals of the third circuits in the shift register circuits) are configured to be connected in one-to-one correspondence to a plurality of gate lines which are sequentially arranged, and reference may be made to the gate lines G(n) to G(n+15) in FIG. 5.

In the gate drive circuit in some embodiments of the present disclosure, two gate drive sub-circuits (S and S') are provided, and each gate drive sub-circuit includes two groups of cascaded shifter register circuits described above. Considering an actual control and a design of a driving signal, in the two different gate drive sub-circuits (S and S'), one gate drive sub-circuit S is connected to gate lines in odd-numbered gate line groups sequentially arranged, and another gate drive sub-circuit S' is connected to gate lines in even-numbered gate line groups sequentially arranged. The gate line groups are configured as follows: a plurality of gate lines arranged in sequence are divided into different gate line groups, each of which includes 8 (N) gate lines (of course, different gate line groups are formed by different gate lines). For example, in FIG. 5, the first 8 solid gate lines G(n) to G(n+7) form a gate line group, and are connected to the gate drive sub-circuit S. The last 8 dotted gate lines G(n+8) to G(n+15) form a gate line group and are connected to the gate drive sub-circuit S'. It will be understood that gate lines in a next gate line group after the gate line group G(n+8) to G(n+15) are shown by solid lines and are connected to the gate drive sub-circuit S, and gate lines in a gate line group after the next gate line group are shown by dotted lines and are connected to the gate drive sub-circuit S'.

It will also be understood herein that gate lines in even-numbered gate line groups arranged in sequence are sequentially connected to the shift register circuits in the gate drive sub-circuit in a cascading order (i.e., the even-numbered gate line groups arranged in sequence are connected in one-to-one correspondence to the shift register circuits sequentially cascaded). For example, gate lines in a first even-numbered gate line group are connected to third signal output terminals of an ith-stage register circuit in the gate drive sub-circuit in one-to-one correspondence, and then, gate lines in a second even-numbered gate line group are connected in one-to-one correspondence to third signal output terminals of a (i+1)th-stage register circuit in the gate drive sub-circuit. A connection method of the gate lines in the odd-numbered gate line groups is similar to the connection method described above, and details are not described herein again.

It will be further noted that, in FIG. 5, the two shift register circuits in the two gate drive sub-circuits are also alternately arranged according to an order in which the even-numbered gate line groups and the odd-numbered gate line groups are sequentially and alternately arranged. It will be understood that FIG. 5 is only an example of a coupling relationship, and should not be regarded as a limitation to the present disclosure. In an actual manufacturing process, according to actual wiring requirements, relative setting positions of respective shift register circuits may change, but as long as the connection relationship is ensured to be the same as the connection relationship in FIG. 5.

In addition, a further description about cascading of the respective shift register circuits in the gate drive sub-circuits will be made below.

Figure 6:
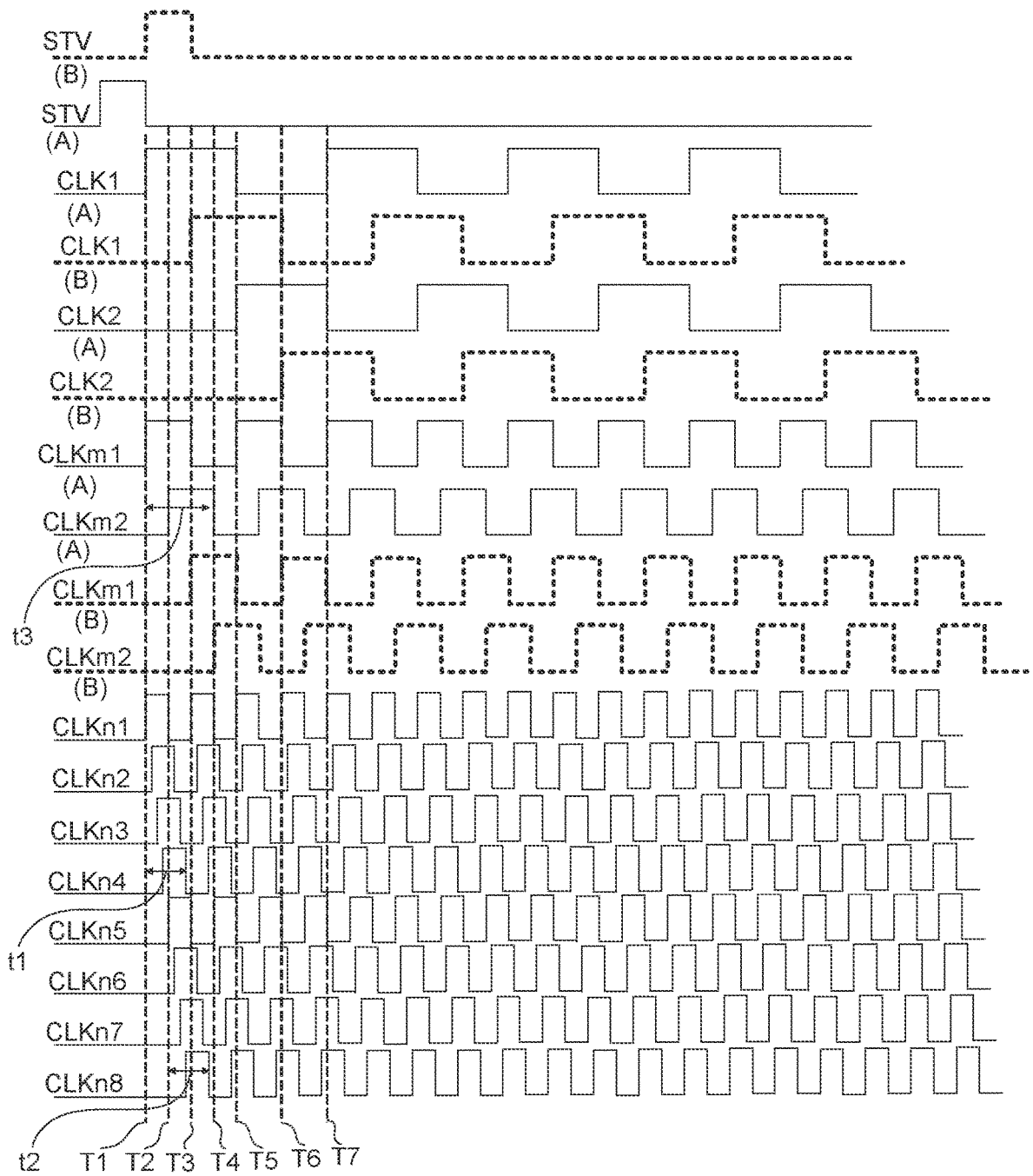
FIG. 6 is a timing diagram of signals of a shift register circuit, according to some embodiments of the present disclosure.

A first signal input terminal INPUT1 of a first-stage shift register circuit is connected to a start signal terminal STV. Of course, since there are two gate drive sub-circuits in some embodiments of the present disclosure, two start signal terminals are provided. For example, STV (A) and STV (B) in FIG. 6 are respectively connected to the first signal input terminals INPUT1 of the first-stage shift register circuits in the two gate drive sub-circuits.

Except for the first-stage shift register circuit, a first signal input terminal INPUT1 of a shift register circuit in any stage is connected to a first signal output terminal OUTPUT1 of a shift register circuit in a previous stage. That is, an output signal from a first signal output terminal OUTPUT1 of a shift register circuit in a present stage is used as an input signal input to a first signal input terminal INPUT1 of a shift register circuit in a next stage.

Except for a last-stage shift register circuit, a first reset signal terminal Reset1 of a shift register circuit in any stage is connected to a first signal output terminal OUTPUT1 of a shift register circuit in a next stage. That is, the output signal from the first signal output terminal OUTPUT1 of the shift register circuit in the present stage is used as an input signal input to a first reset signal terminal Reset1 of a shift register circuit in a previous stage.

In some embodiments of the present disclosure, a start signal terminal STV is generally provided separately for the first signal input terminal INPUT1 of the first-stage shift register circuit, but the present disclosure is not limited thereto. A first signal output terminal OUTPUT1 of the last-stage shift register circuit may also be connected to the first signal input terminal INPUT1 of the first-stage shift register circuit. That is, an output signal from the first signal output terminal OUTPUT1 of the last-stage shift register circuit is used as a start signal input to the first signal input terminal INPUT1 of the first-stage shift register circuit.

Similarly, a first reset signal terminal Reset1 may be separately provided for a first reset signal terminal Reset1 of the last-stage shift register circuit. The first signal output terminal OUTPUT1 of the first-stage shift register circuit may also be connected to the first reset signal terminal Reset1 of the last-stage shift register circuit, which is not limited in the present disclosure.

In addition, it will be noted that, as for the two gate drive sub-circuits, different signal lines are generally provided. The shift register circuit A in the gate drive sub-circuit S shown in FIG. 5 and the shift register circuit B in the gate drive sub-circuit S' shown in FIG. 5 are taken as examples.

For example, a first clock signal in the gate drive sub-circuit S (the first circuit 10) in FIG. 5 is connected to signal line 1 (corresponding to the signal CLK1(A) in FIG. 6) and a second clock signal in the gate drive sub-circuit S is connected to signal line 3 (corresponding to the signal CLK2(A) in FIG. 6). A first clock signal in the gate drive sub-circuit S' (the first circuit 10) is connected to signal line 2 (corresponding to the signal CLK1 (B) in FIG. 6) and a second clock signal in the gate drive sub-circuit S' is connected to signal line 4 (corresponding to the signal CLK2 (B) in FIG. 6).

Similarly, control clock signal terminals CLKm of different gate drive sub-circuits (different second circuits 20) are connected to different signal lines, such as signal lines 9, 10, 11, and 12 in FIG. 5. Two control clock signal terminals of the shift register circuit A in the gate drive sub-circuit S are respectively connected to the signal line 9 and the signal line 10, and two control clock signal terminals of the shift register circuit B in the gate drive sub-circuit S' are respectively connected to the signal line 11 and the signal line 12.

In addition, in a same gate drive sub-circuit, the control clock signal terminals of different second circuits 20 in a same shift register circuit are connected to different signal lines, and the control clock signal terminals of the second circuits in different stages of shift register circuits may be correspondingly shared. For example, two control clock signal terminals of two second circuits in the first-stage shift register circuit A in FIG. 5 are respectively connected to the signal line 9 and the signal line 10, and two control clock signal terminals of two second circuits in a shift register circuit in a next stage (not shown in FIG. 5) in the gate drive sub-circuit S are also correspondingly connected to the signal line 9 and the signal line 10, respectively.

However, as for signal lines connected to the output clock signal terminals of the two gate drive sub-circuits, which may be set in the same way as the above signal lines connected to the control clock signal terminals. That is, different signal lines may be provided for the output clock signal terminals of different gate drive sub-circuits. A difference is that, according to an actual signal design, the output clock signal terminals of the two gate drive sub-circuits may share the signal lines. Of course, a design of sharing the signal lines is selected in some embodiments of the present disclosure.

As for the above case where the output clock signal terminals of the two gate drive sub-circuits share the signal lines, for example, referring to FIG. 5, eight output clock signal terminals of the shift register circuit A in the gate drive sub-circuit S (CLKn1, CLKn2, CLKn3, CLKn4, CLKn5, CLKn6, CLKn7, and CLKn8) are respectively connected to eight different signal lines (signal lines 17 to 24). Similarly, eight output clock signal terminals of the shift register circuit B in the gate drive sub-circuit S' may be respectively connected to the eight signal lines (the signal lines 17 to 24). Of course, a timing relationship among clock signals loaded to the eight signal lines (the signal lines 17 to 24) should be ensured to ensure a normal driving of each circuit.

Based on this, similarly, other signal lines in FIG. 5 will be briefly described below by taking the shift register circuit A in the gate drive sub-circuit S and the shift register circuit B in the gate drive sub-circuit S' shown in FIG. 5 as examples.

Signal line 5 is a signal line connected to the first signal input terminal INPUT1 of the first circuit 10 in the shift register circuit B. Of course, the signal line may be further connected to a first signal output terminal OUTPUT1 of a first circuit 10 in a shift register circuit in a previous stage preceding the shift register circuit B in the gate drive sub-circuit S'.

Signal line 6 is a signal line connected to the first signal input terminal INPUT1 of the first circuit 10 in the shift register circuit A. Of course, the signal line may be further connected to a first signal output terminal OUTPUT1 of a first circuit 10 in a shift register circuit in a previous stage preceding the shift register circuit A in the gate drive sub-circuit S.

Signal line 7 is a signal line connected to the first signal output terminal OUTPUT1 of the first circuit 10 in the shift register circuit A. Of course, the signal line may be further connected to the first reset signal terminal Reset1 of the first circuit 10 in the shift register circuit in the previous stage preceding the shift register circuit A in the gate drive sub-circuit S, and connected to a first signal input signal terminal INPUT1 of a first circuit 10 in a shift register circuit in a next stage. Moreover, the signal line may be further connected to the second signal input terminals INPUT2 of the second circuits 20 in the shift register circuit A (via the line 13 in FIG. 5).

Signal line 8 is a signal line connected to the first signal output terminal OUTPUT1 of the first circuit 10 in the shift register circuit B. Of course, the signal line may be further connected to the first reset signal terminal Reset1 of the first circuit 10 in the shift register circuit in the previous stage preceding the shift register circuit B in the gate drive sub-circuit S', and is connected to a first signal input terminal INPUT1 of a first circuit 10 in a shift register circuit in a next stage. Moreover, the signal line may be further connected to the second signal input terminals INPUT2 of the second circuits 20 in the shift register circuit B.

The noise reductions on the second circuit 20 and the third circuit 30 are performed by using the noise reduction signal output terminal OUTPUT' of the first circuit 10 in the shift register circuit through signal line 27 and signal line 14, respectively.

Signal line 16 is a signal line that provides voltages to the first voltage terminals VGL of the first circuit, the second circuits and the third circuits.

Signal line 26 is a signal line connecting a second signal output terminal OUTPUT2 of a second circuit 20 in a shift register circuit to third signal input terminals INPUT3 of third circuits 30 in the shift register circuit.

Other signal lines are not described herein again, and reference may be made to related connection lines in FIGS. 2-4.

Some embodiments of the present disclosure provide a display device including the gate drive circuit described above. The display device has same beneficial effects as the shift register circuit described above. Since the structure and the beneficial effects of the shift register circuit have been described in detail, details are not described herein again.

It will be noted that, in some embodiments of the present disclosure, the display devices may at least include a liquid crystal display panel and an organic light-emitting diode display panel. For example, the display panel may be applied to any product or component having a display function such as a liquid crystal display, a liquid crystal television, a digital photo frame, a mobile phone, or a tablet computer.

Some embodiments of the present disclosure provide a driving method for the shift register circuit described above. The driving method will be described with reference to FIG. 4 and in combination with FIG. 5 and FIG. 6. The timing signals shown by solid lines in FIG. 6 correspond to the shift register circuit A in FIG. 5, and the timing signals shown by dotted lines correspond to the shift register circuit B in FIG. 5.

The driving method includes:

inputting a first input signal to the first signal input terminal INPUT1 of the first circuit 10, inputting a first clock signal to the first clock signal terminal CLK1 of the first circuit 10, and outputting the first clock signal as an operating voltage to the first signal output terminal OUTPUT1 under control of the first input signal;

inputting two different control clock signals to control clock signal terminals (CLKm1 and CLKm2) of two second circuits (i.e., M=2) respectively, and outputting the two different control clock signals as operating voltages to two second signal output terminals OUTPUT2, respectively under control of the operating voltage output from the first signal output terminal OUTPUT1; and inputting eight different output clock signals to output clock signal terminals (CLKn1 to CLKn8) of eight third circuits 30 (i.e., N=8) in one-to-one correspondence, and outputting the eight different output clock signals as operating voltages to eight third signal output terminals OUTPUT3 respectively under control of the operating voltages output from the second signal output terminals OUTPUT2.

An operating voltage period corresponding to four output clock signals input to four third circuits 30 (N/M=4) connected to a same second circuit 20 (i.e., a period in which the four output clock signals are used as the operating voltages) is within an operating voltage period corresponding to a control clock signal input to the second circuit 20 (i.e., a period in which the control clock signal is used as the operating voltage).

In some embodiments of the present disclosure, as shown in FIG. 5 and FIG. 6, taking the timing signals (the solid lines) corresponding to the shift register circuit A as examples, an operating voltage period t1 corresponding to output clock signals CLKn1 to CLKn4 input to four third circuits 30 connected to a second circuit 20 is within the operating voltage period T1–T3 corresponding to a control clock signal CLKm1(A) input to the second circuit 20. t1 is a time period from a start time of an operating voltage corresponding to the output clock signal CLKn1 to an end time of an operating voltage corresponding to the output clock signal CLKn4 in a same signal cycle. T1 is a start time point of an operating voltage corresponding to the control clock signal CLKm1(A), and T3 is an end time point of the operating voltage corresponding to the control clock signal CLKm1(A). That is, T1–T3 is an operating voltage period corresponding to the control clock signal CLKm1(A) in a signal cycle, and the operating voltage period (T1–T3) is a period in which the control clock signal CLKm1(A) in the second circuit 20 is used as an operating voltage. Similarly, an operating voltage period t2 corresponding to output clock signals CLKn5 to CLKn8 input to four third circuits 30 connected to another second circuit 20 is within an operating voltage period T2–T4 corresponding to a control clock signal CLKm2(A) input to the second circuit 20. A meaning of t2 is the same as that of t1, a meaning of T2–T4 is the same as that of T1–T3, and details are not described herein again. An operating voltage period (T2–T4) is a period in which the control clock signal CLKm2(A) in the second circuit 20 is used as an operating voltage.

In some embodiments of the present disclosure, as shown in FIG. 5 and FIG. 6, an operating voltage period corresponding to two control clock signals input to two second circuits 20 connected to the first circuit 10 (that is, a period in which the two control clock signals are used as the operating voltages) is within an operating voltage period corresponding to the first clock signal input to the first circuit 10 (that is, a period in which the first clock signal is used as the operating voltage).

Taking the timing signals (the solid lines) corresponding to the shift register circuit A as examples, an operating voltage period t3 corresponding to the two control clock signals CLKm1(A) and CLKm2 (A) respectively input to the two second circuits 20 is within an operating voltage period T1–T5 corresponding to the first clock signal CLK1 (A) input to the first circuit 20. t3 is a time period from a start time of the operating voltage corresponding to the control clock signal CLKm1(A) to an end time of an operating voltage corresponding to the control clock signal CLKm2 (A) in the same signal cycle. T1 is a start time point of an operating voltage corresponding to the first clock signal CLK1(A) (T1 is also a start time point of the operating voltage corresponding to the control clock signal CLKm1 (A)), and T5 is an end time point of the operating voltage corresponding to the first clock signal CLK1(A). That is, T1–T5 is an operating voltage period corresponding to the first clock signal CLK1(A) in a signal cycle, and the operating voltage period (T1–T5) is a period in which the first clock signal CLK1(A) in the first circuit 10 is used as the operating voltage.

In some embodiments of the present disclosure, the above driving method further includes:

inputting a first reset signal to the first reset signal terminal Reset1 of the first circuit 10, inputting a second clock signal to the second clock signal terminal CLK2 of the first circuit 10, and outputting the voltage of the first voltage terminal VGL as the turn-off voltage to the first signal output terminal OUTPUT1 under control of the first reset signal and the second clock signal. The second clock signal and the first clock signal are a group of opposite clock signals. For example, referring to CLK1(A) and CLK2 (A) in FIG. 6, when CLK1(A) is at a high level, CLK2(A) is at a low level, and when CLK1(A) is at a low level, CLK2(A) is at a high level.

As described above, in order to reduce the noise of the output signals of the shift register when applied, in some embodiments of the present disclosure, the shift register circuit has the circuit structure in FIG. 4. That is, the first circuit 10 further includes the noise reduction signal output terminal OUTPUT', the second circuit 20 includes the intermediate noise reduction sub-circuit 201, and the third circuit 30 includes the output noise reduction sub-circuit 301. The horizontal step-by-step noise reduction is performed on the second circuit and the third circuit through the noise reduction signal output terminal OUTPUT'.

In this case, a first reset signal is input to the first reset signal terminal Reset1 of the first circuit 10, a second clock signal is input to the second clock signal terminal CLK2, and the voltage of the first voltage terminal VGL is output as the turn-off voltage to the first signal output terminal OUTPUT1 under the control of the first reset signal and the second clock signal. Moreover, the second clock signal is output to the intermediate noise reduction sub-circuit 201 of the second circuit 20 and the output noise reduction sub-circuit 301 of the third circuit 30 through the noise reduction signal output terminal OUTPUT' under the control of the first reset signal and the second clock signal, so as to perform the noise reduction on the second circuit 20 and the third circuit 30.

An entire driving process will be further described below by taking the shift register circuit shown in FIG. 4 (corresponding to the shift register circuit A in FIG. 5) as an example and in combination with turn-on and turn-off processes of the transistors in the circuit (in combination with the timing signals in FIG. 6).

It will be noted that, the turn-on and turn-off processes of the transistors in FIG. 4 will be described below by taking an example in which all the transistors are N-type transistors, but the present disclosure is not limited thereto. All the transistors in FIG. 4 may also be P-type transistors. When the above transistors are all P-type transistors, the first electrode of each transistor is a source and the second electrode of the transistor is a drain. When the above transistors are all N-type transistors, the first electrode of each transistor is a drain and the second electrode of the transistor is a source. The following embodiments are described by taking an example in which each transistor is an N-type transistor. That is, the above operating voltage is a high-level voltage.

In a first phase: (referring to FIG. 4)

The first input signal input to the first signal input terminal INPUT1 is at a high level (that is, a level of the start signal STV input is a high level as for the first-stage shift register circuit, referring to the level of the start signal STV in FIG. 6), the first transistor M1 is turned on, and the high level is charged into the first capacitor C1.

In a second phase:

An electrode plate connected to the pull-up node PU in the first capacitor C1 is at a high potential under situation of the storage capacitance in the previous phase (which may also be considered that the first capacitor C1 is discharged to the pull-up node PU, so that the pull-up node PU is at a high potential). At the same time, a low potential at the first clock signal terminal CLK1 is raised to a high potential, and then a potential at the gate electrode of the second transistor M2 is further raised through a gate-source capacitive coupling of the second transistor M2 (i.e., a potential at the pull-up node PU is further raised). In this case, the second transistor M2 is turned on, and the high potential at the first clock signal terminal CLK1 (referring to the period T1–T5 of CLK1 (A) in FIG. 6) is output to the first signal output terminal OUTPUT1.

The first signal output terminal OUTPUT1 transmits the high potential of the first clock signal terminal CLK1 to the gate electrodes of the seventh transistors M7, and the seventh transistors M7 are turned on to respectively transmit signals from the control clock signal terminals CLKm (referring to the two control clock signals CLKm1 (A) and CLKm2 (A) in the same shift register circuit in FIG. 6) to the second signal output terminals OUTPUT2. It will be understood that, in this case, it is inevitable that a pulse width of the first clock signal is greater than pulse widths of the two control clock signals, and an overall pulse width period t3 of CLKm1(A) and CLKm2(A) is within a pulse width (T1–T5) of CLK1(A). Thus, it may be ensured that signals from the two control clock signal terminals CLKm1 (A) and CLKm2 (A) are completely output to the second signal output terminals OUTPUT2 during a process in which the high potential at the first clock signal terminal CLK1 controls the seventh transistors M7 to be turned on, thereby avoiding a problem that partial signals cannot be transmitted due to a fact that the two control clock signals CLKm1 (A) and CLKm2 (A) are not completely output to the second signal output terminals OUTPUT2 when the seventh transistors M7 are turned off.

Moreover, under control of signals output from two second signal output terminals OUTPUT2 (i.e., CLKm1 (A) and CLKm2 (A)), the eighth transistors M8 in the third circuits are turned on to transmit signals from the output clock signal terminals CLKn (referring to eight control clock signal terminals CLKn1 to CLKn4, and CLKn5 to CLKn8 in the same shift register circuit in FIG. 6) to the third signal output terminals OUTPUT3. It will be understood that, in this case, it is inevitable that the pulse widths of the control clock signals are greater than pulse widths of the output clock signals, an overall pulse width period t1 of CLKn1 to CLKn4 is within a pulse width (T1–T3) of CLKm1(A), and an overall pulse width period t2 of CLKn5 to CLKn8 is within a pulse width (T2–T4) of CLKm2(A). Reasons are the same as a reason that the overall pulse width period t3 of CLKm1(A) and CLKm2(A) is within the pulse width (T1–T5) of CLK1(A), which are not described herein again.

Moreover, in this phase, under control of the high potential at the pull-up node PU, the fifth transistor M5 is turned on, so that the pull-down node PD is ensured to be maintained at a low potential through a low level of the first voltage terminal VGL.

In a third phase:

A high level is input to the first reset signal terminal Reset1, and the third transistor M3 is turned on. The low level of the first voltage terminal VGL pulls down the high potential at the pull-up node PU, and the fifth transistor M5 is turned off. Moreover, in this phase, a high level is output from the second clock signal terminal CLK2 (referring to the period T5–T7 in CLK2 (A) in FIG. 6), and the fourth transistor M4 is turned on to transmit the high level of the second clock signal CLK2 to the pull-down node PD. The sixth transistor M6 is turned on under control of the high potential at the pull-down node PD to reset the first signal output terminal OUTPUT1 through the first voltage terminal VGL (i.e., the turn-off voltage). Moreover, the signal from the second clock signal terminal CLK2 will control the ninth transistor M9 and the tenth transistor M10 to be turned on through the noise reduction signal output terminal OUT-PUT', so as to perform the step-by-step noise reduction on the second circuit 20 and the third circuit 30.

Based on this, in some embodiments of the present disclosure, pulse width values of the above clock signals and corresponding duty ratios are provided, wherein H is a write pulse width of a pixel voltage.

In some embodiments of the present disclosure, the first clock signal and the second clock signal each have a pulse width of 16 H and a duty ratio of 50%. As for the gate drive circuit, the first clock signal and the second clock signal in the two gate drive sub-circuits are delayed by 8 H (i.e., half of the pulse width of the first clock signal or the second clock signal) relative to each other. Referring to FIG. 6, CLK1(B) is delayed by half of the pulse width of CLK1(B) relative to CLK1(A), and CLK2(B) is delayed by half of the pulse width of CLK2(B) relative to CLK2(A).

The pulse width of the control clock signal is 8 H (that is, half of the pulse width of the first clock signal or the second clock signal), and a duty ratio is 50%. The two control clock signals CLKm1 and CLKm2 in the same shift register circuit are delayed by 4 H (i.e., half of the pulse width of the control clock signal CLKm1 or CLKm2) relative to each other. Referring to FIG. 6, CLKm2(A) is delayed by half of the pulse width of CLKm2(A) relative to CLKm1(A), and CLKm2(B) is delayed by half of the pulse width of CLKm2 (B) relative to CLKm1(B). As for shift register circuits coupling adjacent gate line groups in the two gate drive sub-circuits, CLKm1(B) of a shift register circuit corresponding to a present gate line group is delayed by half of a pulse width thereof relative to CLKm2(A) of a shift register circuit corresponding to a previous gate line group.

The pulse width of the output clock signal is 4 H (i.e., half of the pulse width of the control clock signal), and a duty ratio is less than or equal to 50%. Eight output clock signals from the eight third circuits connected to eight adjacent gate lines are sequentially delayed by 1 H. Referring to FIG. 6, CLKn1-CLKn8 are sequentially delayed by 1 H.

It will be noted that, the eight output clock signals in the eight third circuits connected to the eight adjacent gate lines are sequentially delayed by 1 H, and H is guaranteed to be a minimum write pulse width of the pixel voltage. The purpose is to write pixel data to sub-pixels in corresponding turn-on rows row by row through data lines when the gate lines are driven by the gate drive circuit without changing an arrangement manner of the data lines in the display panel.

Of course, it is also permissible to set H to be greater than the minimum write pulse width of the pixel voltage. However, if H is set to be less than the minimum write pulse width of the pixel voltage, the arrangement manner of the data lines in this case cannot ensure a normal writing of the pixel data. In this case, if the gate drive circuit is used to drive the gate lines, a plurality of data lines need to be set as for sub-pixels in a column. Of course, in this case, the above signals need to be adaptively adjusted, which is not limited in the present disclosure, and is not described herein again.

In addition, those skilled in the art will understand that, in the actual display by using the gate drive circuit, the thin film transistors T in sub-pixels in an active area of the display panel is driven by driving the gate lines. Similarly, a high level is used as the operating voltage. That is, the thin film transistor T is an N-type transistor, and has a turn-on voltage V(H) and a turn-off voltage V(L) (generally, the turn-off voltage is the low level of the first voltage terminal VGL described above). Based on this, regarding the above clock signals, a design of the clock signals will be provided below to control the high level and the low level of the circuit, and combined with the simulation diagram of the output signals (FIG. 7) of the first circuit, the second circuits and the third circuits using the design of the clock signals, a related signal control is further explained.

In some embodiments of the present disclosure, a high level of the output clock signal (corresponding to CLKn) is the turn-on voltage V(H) of the thin film transistors T in the active area, and a low level (LVGL) of the output clock signal is less than the turn-off voltage V(L) of the thin film transistors in the active area. Thus, when a thin film transistor T is turned off by using a signal output from the third signal output terminal OUTPUT3, a falling time of the thin film transistor T from the turn-on voltage V(H) to the turn-off voltage V(L) may be reduced.

Figure 7:
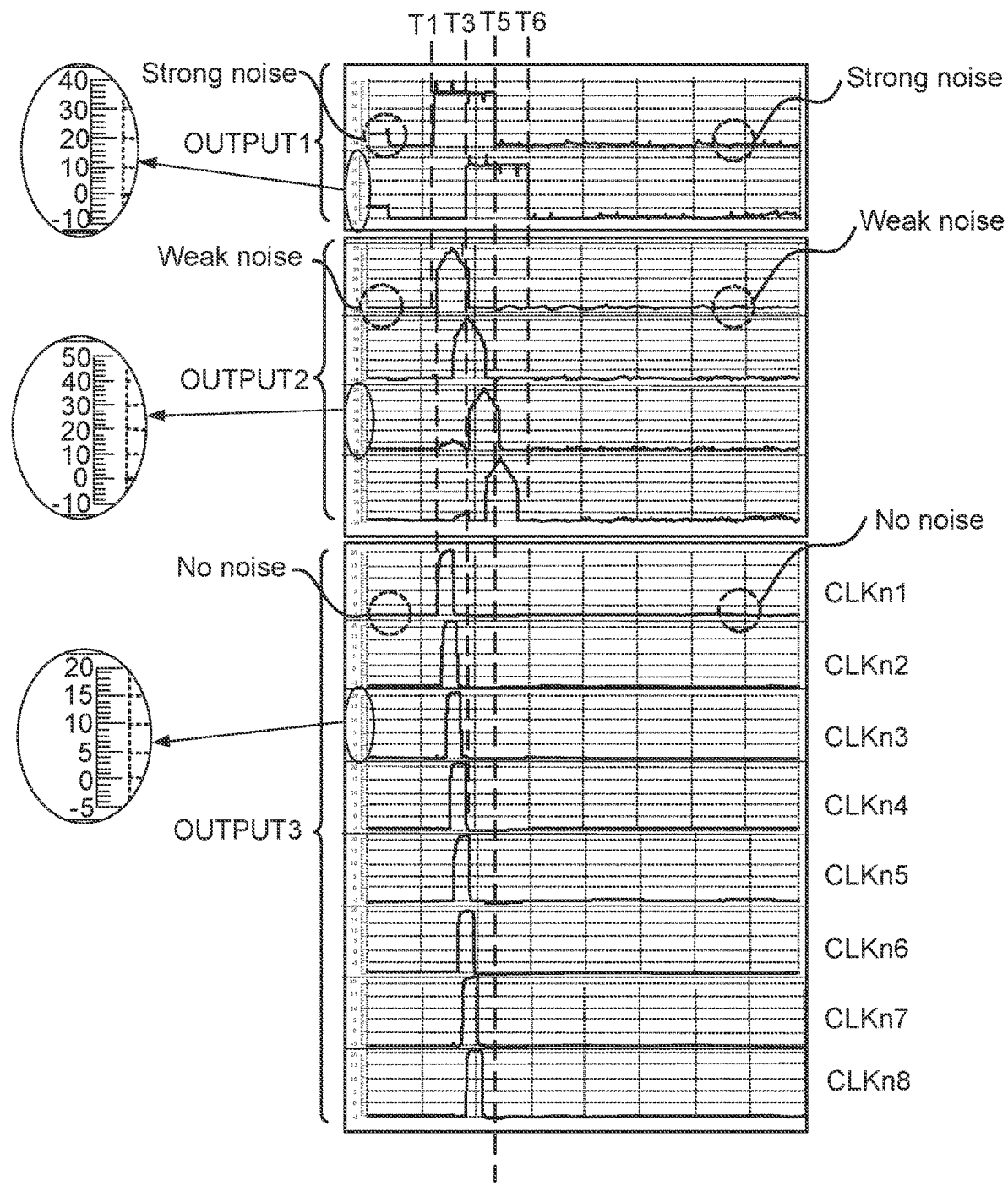
FIG. 7 is a simulation diagram of output signals of a shift register circuit, according to some embodiments of the present disclosure.
Figure 8:
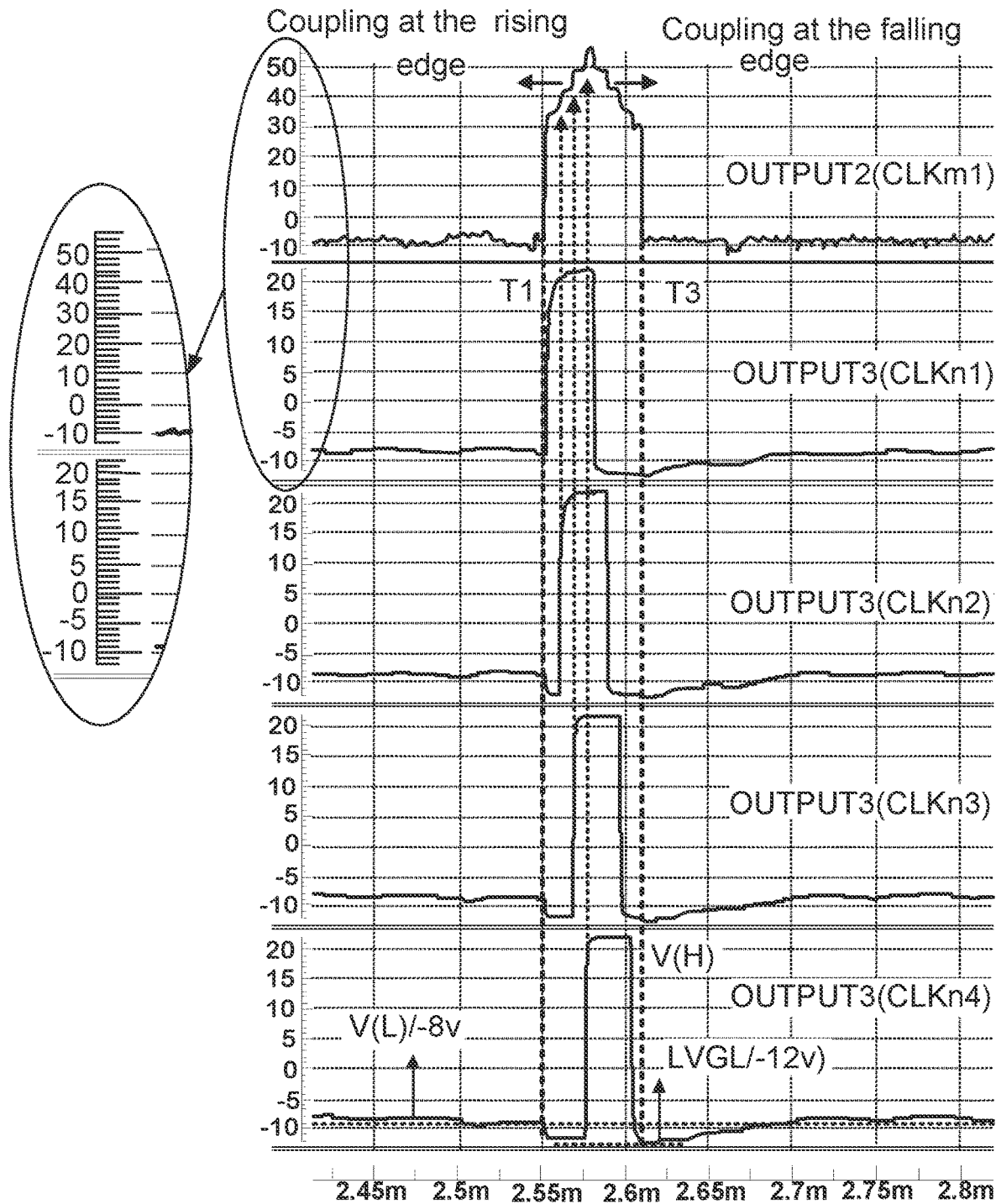
FIG. 8 is a simulation diagram of partial output signals of a shift register circuit, according to some embodiments of the present disclosure.

Referring to FIG. 7 and FIG. 8 (an amplified simulation diagram of a portion of the output signals in FIG. 7), during a period in which a second signal output terminal OUTPUT2 outputs an operating voltage, for example, in the period T1-T3, the eighth transistors M8 in the four third circuits controlled by the second signal output terminal OUTPUT2 are all turned on, and the third signal output terminals OUTPUT3 of the four third circuits sequentially output signals from CLKn1 to CLKn4 in the period T1-T3 (referring to FIG. 7). Referring to FIG. 8, the high level of the signals from CLKn1 to CLKn4 is the turn-on voltage V(H) of the thin film transistors T in the active area, and the low level LVGL of CLKn1 to CLKn4 (for example, −12 v) is less than the turn-off voltage V (L) (for example, −8V) of the thin film transistors in the active area, In this case, an actual effective gate falling time corresponding to the gate line (Gate) connected to the third signal output terminal OUTPUT3 (that is, the time during which the voltage decreases from V(H) to V(L)) decreases (that is, the falling delay time is reduced). In addition, referring to FIG. 8, taking the time point T3 as an example, the second circuit stops outputting the operating voltage via the second signal output terminal OUTPUT2. In this case, the eighth transistor M8 in the third circuit connected to the second circuit is turned off, and a potential at the third signal output terminal OUTPUT3 of the third circuit is gradually reset to the voltage of the first voltage terminal VGL (−8 v) under the control of the noise reduction signal output terminal OUTPUT', thereby ensuring an normal low level (−8 v) of the active area in a maintenance phase, and reducing a leakage current.

It will be noted here that, referring to FIG. 8, affected by a coupling effect of the output signals from the third signal output terminals OUTPUT3 of the third circuits (sequentially corresponding to the input signals from CLKn1 to CLKn4), a waveform of the signal output from the second signal output terminal OUTPUT2 of the second circuit is no longer a standard square wave. According to a sequential input of CLKn1 to CLKn4, a rising edge is coupled first and then a falling edge is coupled, and a whole waveform is a stepped peak pulse. Since this waveform is lifted to a higher voltage after being coupled, it may be ensured that the eighth transistor M8 in the third circuit has a high turn-on current, and an output of the third signal output terminal OUTPUT3 (i.e., a gate output), especially the falling time, is little effected.

In some embodiments of the present disclosure, a high level of the control clock signal (corresponding to CLKm) in the second circuit 20 is greater than the turn-on voltage V(H) of the thin film transistors in the active area, so that the turn-on current of the eighth transistor M8 in the third circuit may be increased.

It will be noted here that, the high level of the control clock signal in the second circuit 20 is greater than the turn-on voltage V(H) of the thin film transistors in the active area. However, those skilled in the art will understand that if the high level of the control clock signal in the second circuit 20 is set to be relatively low, a difference in a rising time of the output of the third signal output terminal OUTPUT3 (i.e., the gate output) may be caused due to a difference in the turn-on current of the eighth transistor M8 in the third circuit. However, the pulse width of the output clock signal designed is 4 H in which first 3 H is a pre-charge time, thereby ensuring that the difference in the rising time of the gate output will not affect an actual charging of pixels.

In some embodiments of the present disclosure, the high levels of the first clock signal (corresponding to CLK1) and the second clock signal (corresponding to CLK2) in the first circuit 10 are less than the turn-on voltage V(H) of the thin film transistors in the active area. In this way, referring to FIG. 4, bias voltages of the sixth transistor M6 in the first circuit 10, the ninth transistor M9 in the second circuit 20, and the tenth transistor M10 in the third circuit 30 may be reduced (the larger the voltage is, the larger the bias voltage is), thereby improving a service life of the transistors without affecting the turn-on current of the eighth transistor M8 in the third circuit.

In addition, on a basis of adopting the above design of the clock signals, referring to the simulation diagram of the output signals from the first circuit, the second circuit and the third circuit in FIG. 7, noise of a signal output from the first signal output terminal OUTPUT1 (including an initial phase and the maintenance phase, that is, before and after an output of the pulse) is large. By adopting the circuits and the design of the clock signals, the step-by-step noise reduction on the second circuit and the third circuit is performed by using signals output by the first circuit. As shown in FIG. 7, it will be seen that the noise of the signal output from the second signal output terminal OUTPUT2 (including the initial phase and the maintenance phase, that is, before and after the output of the pulse) is significantly reduced, and there is substantially no noise of the signal output from the third signal output terminal OUTPUT3 (including the initial phase and the maintenance phase, that is, before and after the output of the pulse). That is, a signal-to-noise ratio of a signal output from the gate drive circuit (having 3.25 transistors and 1 capacitor on average) is substantially the same as a signal-to-noise ratio of the gate drive circuit having 12 transistors and 1 capacitor, which not only reduces the number of the transistors, but also reduces the manufacturing cost, and ensures the narrow bezel of the product.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A shift register circuit, comprising a first circuit, M second circuits, and N third circuits, wherein M and N are both positive integers, N is an integer multiple of M, M is greater than or equal to 2, and a quotient of N and M is greater than or equal to 2;

the first circuit includes a first signal output terminal, and the first circuit is configured to output a voltage of a first clock signal terminal as an operating voltage via the first signal output terminal under control of a signal received by a first signal input terminal, and output a voltage of a first voltage terminal as a turn-off voltage via the first signal output terminal under control of a signal received by a first reset signal terminal and a signal received by a second clock signal terminal;

each second circuit includes a second signal input terminal connected to the first signal output terminal, a second signal output terminal, and a control clock signal terminal, and the second circuit is configured to output a voltage of the control clock signal terminal as an operating voltage via the second signal output terminal under control of a signal received by the second signal input terminal;

each third circuit includes an output clock signal terminal, a third signal output terminal, and a third signal input terminal that is connected to one of second signal output terminals of the M second circuits, and the third circuit is configured to output a voltage of the output clock signal terminal as an operating voltage via the third signal output terminal under control of a signal received by the third signal input terminal;

a second signal output terminal of each second circuit is connected to third signal input terminals of N/M third circuits, and different second signal output terminals of different second circuits are connected to different third signal input terminals.

2. The shift register circuit according to claim 1, wherein the first circuit includes an input sub-circuit, an energy storage sub-circuit, a first output sub-circuit, a first reset sub-circuit, a pull-down control sub-circuit, and a pull-down sub-circuit;

the input sub-circuit is connected to the first signal input terminal and a pull-up node, and the input sub-circuit is configured to transmit a voltage of the first signal input terminal to the pull-up node under the control of the first signal input terminal;

the energy storage sub-circuit is connected to the pull-up node and the first signal output terminal, and the energy storage sub-circuit is configured to store a voltage on the pull-up node or charge the pull-up node;

the first output sub-circuit is connected to the pull-up node, the first clock signal terminal and the first signal output terminal, and the first output sub-circuit is configured to transmit the voltage of the first clock signal terminal to the first signal output terminal under control of the pull-up node;

the first reset sub-circuit is connected to the first reset signal terminal, the first voltage terminal and the pull-up node, and the first reset sub-circuit is configured to transmit the voltage of the first voltage terminal to the pull-up node under the control of the first reset signal terminal;

the pull-down control sub-circuit is connected to the second clock signal terminal, the first voltage terminal, the pull-up node, and a pull-down node, and the pull-down control sub-circuit is configured to transmit a voltage of the second clock signal terminal to the pull-down node under the control of the second clock signal terminal, or transmit the voltage of the first voltage terminal to the pull-down node under the control of the pull-up node; and the pull-down sub-circuit is connected to the pull-down node, the first voltage terminal and the first signal output terminal, and the pull-down sub-circuit is configured to transmit the voltage of the first voltage terminal to the first signal output terminal under control of the pull-down node.

3. The shift register circuit according to claim 2, wherein the input sub-circuit includes a first transistor, a gate electrode and a first electrode of the first transistor are connected to the first signal input terminal, and a second electrode of the first transistor is connected to the pull-up node; and/or the energy storage sub-circuit includes a first capacitor, one end of the first capacitor is connected to the pull-up node, and another end of the first capacitor is connected to the first signal output terminal; and/or the first output sub-circuit includes a second transistor, a gate electrode of the second transistor is connected to the pull-up node, a first electrode of the second transistor is connected to the first clock signal terminal, and a second electrode of the second transistor is connected to the first signal output terminal; and/or the first reset sub-circuit includes a third transistor, a gate electrode of the third transistor is connected to the first reset signal terminal, a first electrode of the third transistor is connected to the pull-up node, and a second electrode of the third transistor is connected to the first voltage terminal; and/or the pull-down control sub-circuit includes a fourth transistor and a fifth transistor, a gate electrode and a first electrode of the fourth transistor are connected to the second clock signal terminal, and a second electrode of the fourth transistor is connected to the pull-down node; and a gate electrode of the fifth transistor is connected to the pull-up node, a first electrode of the fifth transistor is connected to the pull-down node, and a second electrode of the fifth transistor is connected to the first voltage terminal; and/or the pull-down sub-circuit includes a sixth transistor, a gate electrode of the sixth transistor is connected to the pull-down node, a first electrode of the sixth transistor is connected to the first signal output terminal, and a second electrode of the sixth transistor is connected to the first voltage terminal.

4. The shift register circuit according to claim 3, wherein the second circuit includes a seventh transistor, a gate electrode of the seventh transistor is connected to the second signal input terminal, a first electrode of the seventh electrode is connected to the control clock signal terminal, and a second electrode of the seventh transistor is connected to the second signal output terminal.

5. The shift register circuit according to claim 4, wherein the third circuit includes an eighth transistor, a gate electrode of the eighth transistor is connected to the third signal input terminal, a first electrode of the eighth transistor is connected to the output clock signal terminal, and a second electrode of the eighth transistor is connected to the third signal output terminal.

6. The shift register circuit according to claim 5, wherein the first circuit further includes the noise reduction signal output terminal, the second circuit includes the intermediate noise reduction sub-circuit, and the third circuit includes the output noise reduction sub-circuit, the noise reduction signal output terminal is connected to the pull-down node;

the intermediate noise reduction sub-circuit includes a ninth transistor, a gate electrode of the ninth transistor is connected to the noise reduction signal output terminal, a first electrode of the ninth transistor is connected to the second signal output terminal, and a second electrode of the ninth transistor is connected the first voltage terminal; and the output noise reduction sub-circuit includes a tenth transistor, a gate electrode of the tenth transistor is connected to the noise reduction signal output terminal, a first electrode of the tenth transistor is connected to the third signal output terminal, and a second electrode of the tenth transistor is connected to the first voltage terminal.

7. The shift register circuit according to claim 1, wherein the first circuit further includes a noise reduction signal output terminal, and the first circuit is configured to output a voltage of the second clock signal terminal as a noise reduction voltage via the noise reduction signal output terminal under control of a signal received by the second clock signal terminal;

the second circuit further includes an intermediate noise reduction sub-circuit, the intermediate noise reduction sub-circuit is connected to the noise reduction signal output terminal, the first voltage terminal and the second signal output terminal, and the intermediate noise reduction sub-circuit is configured to output the voltage of the first voltage terminal to the second signal output terminal under control of the noise reduction signal output terminal; and the third circuit further includes an output noise reduction sub-circuit, the output noise reduction sub-circuit is connected to the noise reduction signal output terminal, the first voltage terminal and the third signal output terminal, and the output noise reduction sub-circuit is configured to output the voltage of the first voltage terminal to the third signal output terminal under the control of the noise reduction signal output terminal.

8. The shift register circuit according to claim 1, wherein M is less than or equal to 4, and the quotient of N and M is less than or equal to 6.

9. The shift register circuit according to claim 1, wherein M is 2, and N is 8.

10. A gate drive circuit, comprising two gate drive sub-circuits, wherein each gate drive sub-circuit includes at least two stages of cascaded shift register circuits according to claim 1;

third signal output terminals of the two gate drive sub-circuits are configured to be connected to gate lines arranged in sequence; and the gate lines are divided into different gate line groups in a manner in which N gate lines form a gate line group, in the two gate drive sub-circuits, one gate drive sub-circuit is configured to be connected to gate lines in odd-numbered gate line groups arranged in sequence, and another gate drive sub-circuit is configured to be connected to gate lines in even-numbered gate line groups arranged in sequence;

in each gate drive sub-circuit:

a first signal input terminal of a first-stage shift register circuit is connected to a start signal terminal;

except for the first-stage shift register circuit, a first signal input terminal of a shift register circuit in any stage is connected to a first signal output terminal of a shift register circuit in a previous stage; and except for a last-stage shift register circuit, a first reset signal terminal of a shift register circuit in any stage is connected to a first signal output terminal of a shift register circuit in a next stage.

11. A display device, comprising the gate drive circuit according to claim 10.

12. A driving method for the shift register circuit according to claim 1, the driving method comprising:

receiving, by the first circuit, a first input signal from the first signal input terminal and a first clock signal from the first clock signal terminal;

outputting, by the first circuit, the first clock signal as an operating voltage via the first signal output terminal under control of the first input signal;

receiving, by the M second circuits, M different control clock signals from control clock signal terminals respectively, wherein an operating voltage period corresponding to the first clock signal received by the first circuit covers an operating voltage period corresponding to the M different control clock signals received by the M second circuits;

outputting, by the M second circuits, the M different control clock signals as operating voltages respectively via M second signal output terminals under control of the operating voltage output via the first signal output terminal;

receiving, by the N third circuits, N different output clock signals from output clock signal terminals respectively, wherein an operating voltage period corresponding to a control clock signal received by one of the M second circuits covers an operating voltage period corresponding to output clock signals received by third circuits connected to a same second circuit;

outputting, by the N third circuits, the N different output clock signals as operating voltages respectively via N third signal output terminals-under control of the operating voltages output via the second signal output terminals, receiving, by the first circuit, a first reset signal from the first reset signal terminal and a second clock signal from the second clock signal terminal, wherein the second clock signal and the first clock signal is a group of opposite clock signals; and outputting, by the first circuit, a voltage of the first voltage terminal as a turn-off voltage via the first signal output terminal under control of the first reset signal and the second clock signal.

13. The driving method according to claim 12, wherein in a case where the first circuit further includes a noise reduction signal output terminal, each second circuit includes an intermediate noise reduction sub-circuit, and each third circuit includes an output noise reduction sub-circuit, the driving method further comprises:

after receiving the second clock signal from the second clock signal terminal, outputting, by the first circuit, the second clock signal to the intermediate noise reduction sub-circuit of the second circuit and the output noise reduction sub-circuit of the third circuit through the noise reduction signal output terminal under the control of the second clock signal.

14. The driving method according to claim 12, wherein all operating voltages are high level voltages.

15. The driving method according to claim 14, wherein the N different output clock signals received by N output clock signal terminals of the N third circuits are sequentially delayed by at least a minimum write pulse width of a pixel voltage.

16. The driving method according to claim 14, wherein the first clock signal and the second clock signal each have a pulse width of 16H and a duty ratio of 50%;
- each control clock signal has a pulse width of 8H and a duty ratio of 50%; and
- each output clock signal has a pulse width of 4H and a duty ratio of less than or equal to 50%, wherein
- H is a write pulse width of a pixel voltage.

17. The driving method according to claim 14, wherein
- a high level of each output clock signal is a turn-on voltage of thin film transistors in an active area, and a low level of the output clock signal is less than a turn-off voltage of the thin film transistors in the active area; and/or
- a high level of each control clock signal is greater than a turn-on voltage of the thin film transistors in the active area; and/or
- high levels of the first clock signal and the second clock signal are less than the turn-on voltage of the thin film transistors in the active area.

* * * * *

UNITED STATES PATENT AND TRADEMARK OFFICE
CERTIFICATE OF CORRECTION

PATENT NO. : 10,998,068 B2  
APPLICATION NO. : 16/623669  
DATED : May 4, 2021  
INVENTOR(S) : Zhuo Xu et al.

Page 1 of 1

It is certified that error appears in the above-identified patent and that said Letters Patent is hereby corrected as shown below:

In the Claims

Column 24, Lines 11-51, should read:
12. A driving method for the shift register circuit according to claim 1, the driving method comprising:
    receiving, by the first circuit, a first input signal from the first signal input terminal and a first clock signal from the first clock signal terminal;
    outputting, by the first circuit, the first clock signal as an operating voltage via the first signal output terminal under control of the first input signal;
    receiving, by the M second circuits, M different control clock signals from control clock signal terminals respectively, wherein an operating voltage period corresponding to the first clock signal received by the first circuit covers an operating voltage period corresponding to the M different control clock signals received by the M second circuits;
    outputting, by the M second circuits, the M different control clock signals as operating voltages respectively via M second signal output terminals under control of the operating voltage output via the first signal output terminal;
    receiving, by the N third circuits, N different output clock signals from output clock signal terminals respectively, wherein an operating voltage period corresponding to a control clock signal received by one of the M second circuits covers an operating voltage period corresponding to $\frac{N}{M}$ output clock signals received by $\frac{N}{M}$ third circuits connected to a same second circuit;
    outputting, by the N third circuits, the N different output clock signals as operating voltages respectively via N third signal output terminals-under control of the operating voltages output via the second signal output terminals,
    receiving, by the first circuit, a first reset signal from the first reset signal terminal and a second clock signal from the second clock signal terminal, wherein the second clock signal and the first clock signal is a group of opposite clock signals; and
    outputting, by the first circuit, a voltage of the first voltage terminal as a turn-off voltage via the first signal output terminal under control of the first reset signal and the second clock signal.

Signed and Sealed this  
Twenty-first Day of September, 2021

Drew Hirshfeld  
*Performing the Functions and Duties of the  
Under Secretary of Commerce for Intellectual Property and  
Director of the United States Patent and Trademark Office*